United States Patent [19]

Takenaka et al.

[11] Patent Number: 4,930,002
[45] Date of Patent: May 29, 1990

[54] MULTI-CHIP MODULE STRUCTURE

[75] Inventors: Takaji Takenaka; Tositada Netsu; Hidetaka Shigi, all of Hadano; Masakazu Yamamoto, Kodaira, all of Japan

[73] Assignee: Hitachi, Ltd., Tokyo, Japan

[21] Appl. No.: 171,770

[22] Filed: Mar. 22, 1988

[30] Foreign Application Priority Data

Apr. 1, 1987 [JP] Japan .................. 62-77518

[51] Int. Cl.⁵ .................. H01L 23/16; H01L 39/02
[52] U.S. Cl. .................. 357/75; 357/74; 357/80
[58] Field of Search .................. 357/75, 74, 80, 71

[56] References Cited

U.S. PATENT DOCUMENTS

| | | | |
|---|---|---|---|
| 4,221,047 | 9/1980 | Narken et al. | 357/75 |
| 4,231,154 | 11/1980 | Gazdik et al. | 357/75 |
| 4,602,271 | 7/1986 | Dougherty, Jr. et al. | 357/80 |
| 4,649,417 | 3/1987 | Burgess et al. | 357/80 |
| 4,811,082 | 3/1989 | Jacobs et al. | 357/75 |

FOREIGN PATENT DOCUMENTS

| | | | |
|---|---|---|---|
| 0070533 | 7/1982 | European Pat. Off. | |
| 0285064 | 10/1988 | European Pat. Off. | 357/75 |
| 2549641 | 7/1984 | France | |
| 0015264 | 1/1983 | Japan | 357/75 |
| 0024255 | 2/1986 | Japan | 357/75 |
| 0027667 | 2/1986 | Japan | 357/75 |
| 61-27667 | 2/1986 | Japan | |
| 0001258 | 1/1987 | Japan | 357/75 |

OTHER PUBLICATIONS

European Search Report from European Application No. EP 88 10 4979.
S. Cherensky, D. Genin and I. Modi, "Electrical Design and Analysis of the Air-Cooled Module (ACM) in IBM System/4381", Nov. 1, 1983, (English Translation Provided).

Primary Examiner—Rolf Hille
Assistant Examiner—Hoanganh Le
Attorney, Agent, or Firm—Fay, Sharpe, Beall, Fagan, Minnich & McKee

[57] ABSTRACT

In a pin grid array type multi-chip module structure comprised of a ceramic multi-layer wiring board having the top surface on which a plurality of semiconductor devices are carried, divisional board areas each having the same size are respectively allotted to individual semiconductor devices of the same type. Within respective divisional board areas, the positional relation between the array arrangement of connecting pads on the top surface for connection to the semiconductor devices and the array arrangement of I/O pins on the bottom surface of the board is so determined as to be constant. Metallized patterns inside the board which are to be connected power supply I/O pins and ground I/O pins are made constant for respective divisional board areas allotted to individual semiconductor devices of the same type.

4 Claims, 5 Drawing Sheets 4,930,002

MULTI-CHIP MODULE STRUCTURE

BACKGROUND OF THE INVENTION

This invention relates to a multi-chip module structure for use in general electronic appliances, and more particularly to a multi-chip module structure of the type suitably applied to a ceramic wiring board having a grid array of pins adapted to carry or support a plurality of semiconductor chips.

For example, "ICCD, '83 The New IBM 4831" is known as a prior art reference disclosing a multi-chip module structure. In this prior art multi-chip module structure, the number of power supply input/output (I/O) pins (inclusive of grounding pins) is different for a plurality of divisional board areas which are defined by dividing the board in accordance with individual semiconductor devices such as semiconductor chips or LSI's carried or supported by the module structure and ranges from zero to eleven. In other words, the number of power supply I/O pins differs from one location to another on the board at which individual semiconductor devices are supported by the module. Consequently, the amount of DC power supply voltage drop occurring between power supply I/O pins and each semiconductor device connected thereto differs with locations at which these semiconductor devices are supported, causing a decrease in the noise margin.

JP-A-61-27667 discloses another prior art wherein the pitch or distance between adjacent connecting pads arrayed on a board in the form of a grid (hereinafter simply referred to as the grid pitch of connecting pads) is made constant even when the grid pitch of pins of one semiconductor device carried on the board top surface is different from that of pins of another semiconductor device. This literature, however, fails to consider the positional relation between the connecting pads on the board top surface and I/O pins on the board bottom surface. Accordingly, even in this literature, the position of power supply I/O pins differs with respective divisional board areas allotted to individual semiconductor devices carried on the board.

It should therefore be understood that in any of the prior art the wiring for the power supply I/O pins of the ceramic multi-layer wiring board differs with the individual semiconductor devices and a power supply layer (including a grounding layer) can not be realized with a metallized pattern which has a constant configuration for all of semiconductor devices of the same type. This disadvantage seriously bottlenecks the design work for multi-chip modules carried out through the use of the Computer Aided Design (CAD) method.

In other words, the wiring for the power supply I/O pins of the ceramic multi-layer wiring board can not be prepared by sufficiently taking advantage of repeating an identical metallized pattern which is applied to individual semiconductor devices of the same type but is formed differently even for the identical type semiconductor devices.

Accordingly, the prior art fails to consider that the number of power supply I/O pins of the ceramic multi-layer wiring board supporting a great number of semiconductor devices and the number of through holes bridging the board should respectively be made identical for individual semiconductor devices of the same type and that the relative position of the power supply I/O pins to semiconductor device connecting pads should also be made identical for the individual identical type semiconductor devices, thus raising the following problems.

More particularly, in the prior art, an expansion layer, a power supply layer and a conversion layer which constitute a ceramic multi-layer wiring board and which are used in common for each semiconductor device of the same type differ with locations of the divisional board areas for individual semiconductor devices of the same type and have no repeat of pattern. Therefore, the design work and the mask preparation work for the commonly used layers become time-consuming and efficient check and inspection during the fabrication process of the ceramic multi-layer wiring board is difficult to achieve. Further, examination and detection of faults during the work for correcting manufacture defects and design defects is also time-consuming. In the previous explanation, the expansion layer is a layer adapted to transfer the grid pitch of semiconductor device connecting pads to the grid pitch of signal conductors of a signal wiring layer when both the grid pitches are inconsistent, and the conversion layer is a layer adapted to reduce the grid pitch of I/O pin connecting pads to the grid pitch of signal conductors of the signal wiring layer so that the former grid pitches are transferred to the latter grid pitch.

SUMMARY OF THE INVENTION

An object of this invention is to provide a multi-chip module structure which can maintain the repeat of pattern and reduce work time for design, ceramic multi-layer board fabrication, inspection and repair by using a power supply layer of a metallized pattern which is used in common for individual semiconductor devices of the same type mounted on the wiring board.

According to the invention, to accomplish the above object, a ceramic multi-layer wiring board is divided into different area groups having different sizes in accordance with different types of semiconductor devices supported by the ceramic multi-layer wiring board, each area group having a set of divisional board areas of the same size dedicated to individual semiconductor devices of the same type, and metallized patterns for power supply for respective dedicated areas, excepting signal wiring patterns within respective dedicated areas being used for interconnecting the individual semiconductor devices, are made identical to each other, thereby maintaining the repeat of metallized pattern.

DESCRIPTION OF THE PREFERRED EMBODIMENT

The invention will now be described by way of example with reference to the accompanying drawings.

Figure 1:
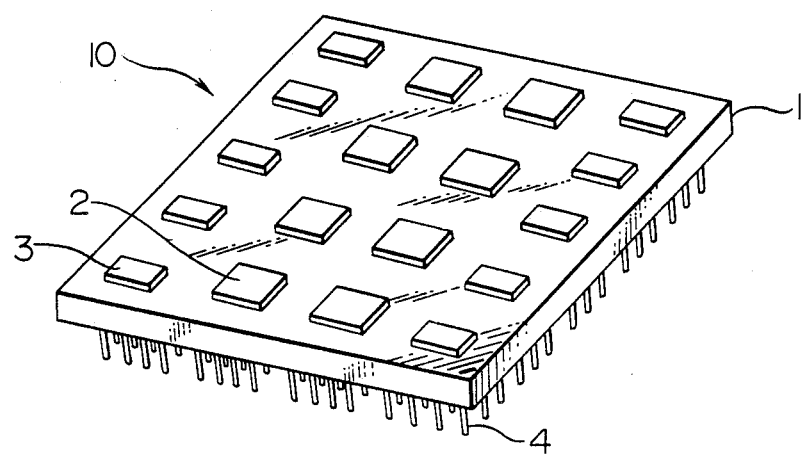
FIG. 1 is a perspective view illustrating a multi-chip module structure according to an embodiment of the invention.

FIG. 1 illustrates, in perspective view form, a preferred embodiment of a multi-chip module structure according to the invention. Referring to FIG. 1, reference numeral 1 designates a ceramic multi-layer wiring board having a first surface on which semiconductor devices such as LSI's are mounted, semiconductor devices 2 being of the type different from that of semiconductor devices 3. In FIG. 1, eight semiconductor devices 2 and ten semiconductor devices 3 are mounted on the board 1. Reference numeral 4 designates I/O pins arrayed on the bottom (a second surface) of the board 1 and a single multi-chip module structure 10 is constructed by comprising the board 1, semiconductor devices 2 and 3 and I/O pins 4. The I/O pins 4 include power supply I/O pins and signal I/O pins, as will be described later.

Figure 2:
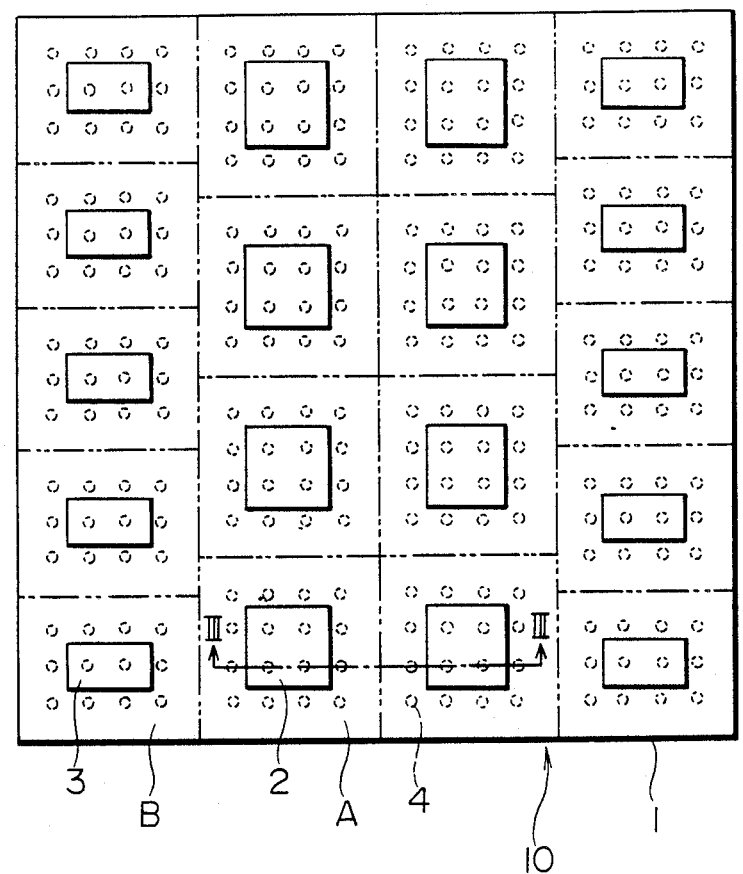
FIG. 2 is a plan view of the multi-chip module structure shown in FIG. 1.

FIG. 2 illustrates, in plan view form, the multi-chip module structure 10 shown in FIG. 1. Referring to FIG. 2, divisional board areas A of the same size are respectively allotted to the eight semiconductor devices 2, and divisional board areas B of the same size are respectively allotted to the ten semiconductor devices 3. Each divisional board area A is allotted with sixteen I/O pins 4 and the positional relation between each semiconductor device 2 and the I/O pins 4 within each area A is made constant. The above is also true for each divisional board area B.

Figure 3:
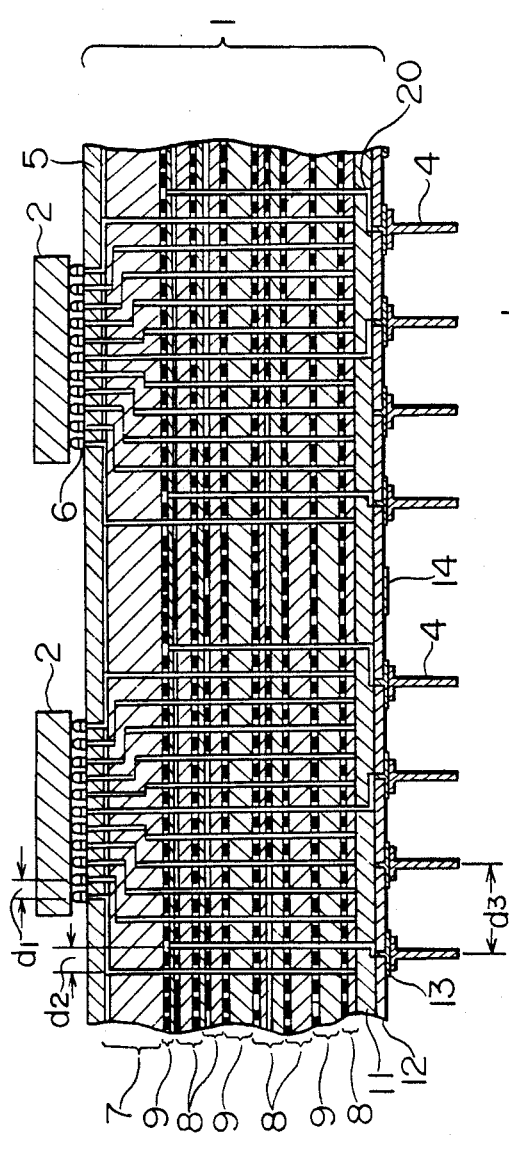
FIG. 3 is a fragmentary sectional view taken on the line III—III of FIG. 2.

The multi-chip module structure 10 shown in FIG. 2 is sectioned on the line III—III to provide a fragmentary sectional view as shown in FIG. 3.

FIG. 3 clearly illustrates the ceramic multi-layer wiring board 1 according to the invention which is comprised of the following layers.

Top layer 5: a layer having connecting pads 6 for supporting the semiconductor device 2.

Expansion layer 7: a layer for expanding the grid pitch $d_1$ of semiconductor device connecting pads to the grid pitch $d_2$ of signal conductors of a semiconductor device interconnecting signal wiring layer 8 when both grid pitches are inconsistent.

Power supply layer 9: a layer interposed between signal wiring layers 8 and adapted to perform characteristic impedance matching of signal wiring conductors and supply power voltage.

Signal wiring layer 8: a layer for logical wiring connection between semiconductor devices.

Conversion layer 11: a wiring layer for transferring the grid pitch $d_3$ of I/O pins 4 to the grid pitch $d_2$ of signal conductors of the signal wiring layer.

Bottom layer 12: a layer having pads 13 for connection to the I/O pins 4.

In the ceramic multi-layer wiring board of the invention having the layers described as above, the interfaces on the top and the bottom layers are determined in accordance with the types of the semiconductor devices. Additionally, the wiring patterns (metallized patterns) on the expansion layer 7, conversion layer 11 and power supply layer 9 are determined so that the positional relation between the connecting pads 6 and grid points connected to top and bottom signal conductors of the signal wiring layer (the positional relation between the connecting pads 6 and the I/O pin connecting pads 13) may be fixed.

With the above construction, the number of I/O pins 4, the relative position between semiconductor device connecting pads 6 and I/O pins 4 and the position of power supply I/O pins can be made uniform for individual semiconductor devices of the same type within respective divisional board areas for the individual semiconductor devices of the same type. In this manner, the metallized patterns of other layers than the signal wiring layer can be fixed for individual semiconductor devices of the same type.

The configuration of FIG. 3 will now be described in greater detail.

The ceramic multi-layer wiring board 1 comprises, as shown in FIG. 3, the expansion layer 7, the conversion layer 11, and a plurality of power supply layers 9 and a plurality of signal wiring layers 8 which are interposed between the expansion layer 7 and the conversion layer 11. The top surface of the expansion layer 7 forms one major surface (first surface) of ceramic multi-layer wiring board 1 to which a plurality of semiconductor devices 2, 3 are connected in flip chip fashion. The bottom surface of the bottom layer 12 forms the other major surface (second surface) of ceramic multi-layer wiring board 1 to which the I/O pins 4 are bonded in matrix pattern by brazing silver solder, Au-Sn solder or Au-Ge solder. The I/O pins 4 are thinned out at the boundary between adjacent divisional board areas for the semiconductor devices 2 or 3 to leave behind pads 14 removed of I/O pins 4. In FIG. 3, two semiconductor devices 2 are illustrated as semiconductor chips of the same type. The ceramic multi-layer wiring board 1 comprises a plurality of groups of the expansion layer 7, signal wiring layer 8, power supply layer 9, conversion layer 11 and through hole 20 directed from the expansion layer 7 toward the signal wiring layer 8. Respective patterns of the expansion layer 7, power supply layer 9 and conversion layer 11 excepting the pattern of signal conductors of signal wiring layer 8 interconnecting the semiconductor devices are reiteratively repeated in individual groups irrespective of locations of the semiconductor devices of the same type supported by the board.

In the above configuration, the expansion layer 7 is adapted to transfer the grid pitch $d_1$ of connecting pads 6 for connection to the semiconductor device 2 to the grid pitch $d_2$ of conductors of the signal wiring layer 8 and power supply layer. Additionally, a plurality of expansion layers 7 may be provided as necessary. The number of either of the power supply layers 9 and signal wiring layers 8 interposed between the expansion layer 7 and the conversion layer 11 may desirably be determined, and the power supply layer 9 and signal wiring layer 8 may be laminated in desired order. The power supply layer 9 is connected to signal conductors of the signal wiring layer 8 by way of through holes to supply power voltage and ground potential and to perform matching of characteristic impedances of the signal conductors, and the signal wiring layer 8 provides logical wiring interconnecting the semiconductor devices 2. The plurality of signal wiring layers 8 are mutually interconnected by means of through-hole metallizing. The conversion layer 11 transfers the grid pitch $d_3$ of I/O pins 4 to the grid pitch $d_2$ of signal conductors of the signal wiring layer 8 and a plurality of conversion layers 11 may be provided as necessary. The I/O pins 4 are arrayed in a matrix at a predetermined pitch on the other major surface of the multi-layer wiring board and adapted to apply input/output signals and power supply voltage.

In the ceramic multi-layer wiring board 1 constructed as above, respective wiring patterns of the expansion layer 7, conversion layer 11 and power supply layer 9 are so determined that the array arrangements of grid points connected to top and bottom signal conductors of the signal wiring layer 9, that is, the positional relation between the pads 6 for connection to the semiconductor device 2 and the pads 14 for connection to the I/O pins 4 is made identical for individual semiconductor devices of the same type.

Figure 4:
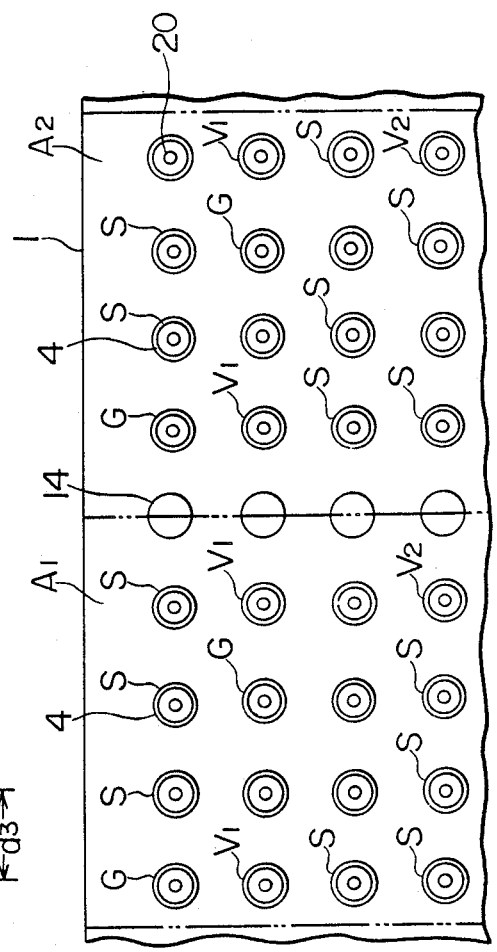
FIG. 4 is a plan view illustrating a part of the FIG. 1 multi-chip module structure as viewed from I/O pins.

FIG. 4 illustrates, in plan view form, a part of the multi-chip module structure of FIG. 1 as viewed from the I/O pins 4. Referring to FIG. 4, divisional board areas $A_1$ and $A_2$ are respectively allotted to associated semiconductor devices 2 having the same size. Of the I/O pins 4, I/O pins represented by G serve as power voltage (also grounding I/O pins) supply I/O pins, I/O pins represented by $V_1$ serve as first power voltage (for example, $-2$ V) supply I/O pins, I/O pins represented by $V_2$ serve as second power voltage (for example, $-3$ V) supply I/O pins and I/O pins represented by S serve as signal I/O pins. As best seen in FIG. 4, the arrayed arrangements of the power supply I/O pins (G, $V_1$ and $V_2$ I/O pins) are identical for the divisional board areas $A_1$ and $A_2$. This ensures that the amount of DC power supply voltage drop can be made equal for indivisual semiconductor devices of the same type. Denoted by 14 are I/O pads which are formed by thinning out I/O pins at the boundary between the divisional board areas $A_1$ and $A_2$.

FIGS. 5a to 5d are diagrams as viewed from the I/O pins, illustrating layers within a divisional board area A allotted to one semiconductor device 2 of the multi-chip module structure 10 shown in FIG. 3.

Figure 5A:
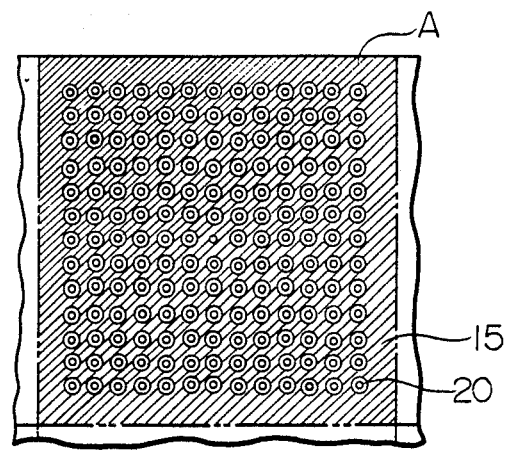
FIGS. 5a, 5b, 5c and 5d are fragmentary plan views illustrating examples of principal layers constituting the multi-chip module structure shown in FIG. 3.
Figure 5B:
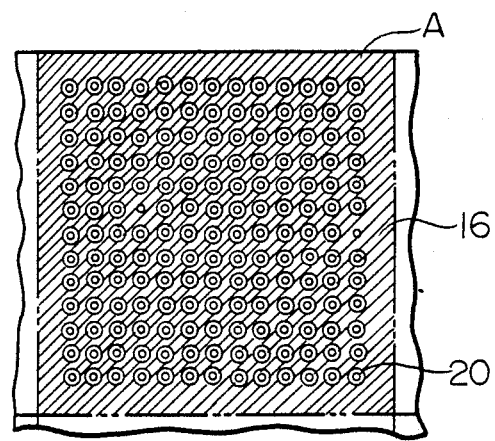
Figure 5C:
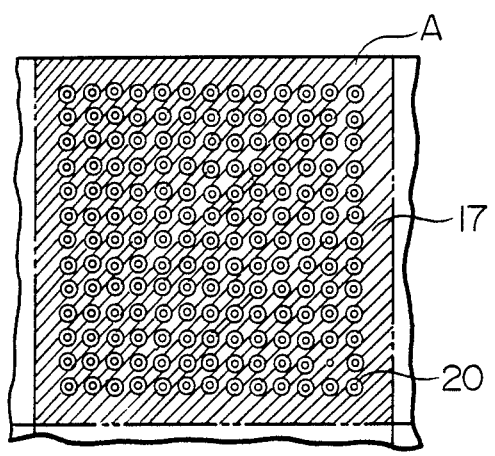
Figure 5D:
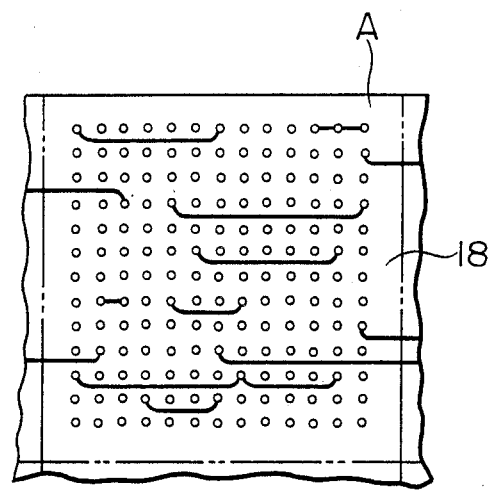

Particularly, FIG. 5a illustrates a metallized pattern 15 of a grounding layer included in the power supply layer 9. FIG. 5b illustrates a metallized pattern 16 of a first power voltage supply layer included in the power supply layer 9. FIG. 5c illustrates a metallized pattern 17 of a second power voltage supply layer included in the power supply layer 9. FIG. 5d illustrates a typical example of a metallized pattern of the signal wiring layer 8. Since the respective metallized patterns 15, 16 and 17 shown in FIGS. 5a to 5c are made identical for individual semiconductor devices of the same type, the design process can be reduced and electrical characteristics can be uniformed. Obviously, the metallized pattern shown in FIG. 5d is different even for individual identical type semiconductor devices.

By determining the grid arrangement of signal conductors of the signal wiring layer 8 in accordance with the individuality of the semiconductor devices 2 in the manner described as above, the array arrangement of the semiconductor device connecting pads 6 and the array arrangement of the I/O pins 4 can be made identical for individual semiconductor devices of the same type and hence the respective metallized patterns of the layers excepting the signal conductor patterns in the ceramic multi-layer wiring board 1 can be made identical for individual semiconductor devices of the same type, thereby ensuring that work time for design of the multi-layer wiring board, work time for fabrication and inspection and work time for repair can be reduced.

As described above, according to the present invention, the respective metallized wiring patterns of other layers than the signal wiring layer within the ceramic multi-layer wiring board can be used in common for individual identical types of semiconductor devices and therefore the following beneficial effects can be obtained.

(1) By preparing one set of patterns used in common for individual semiconductor devices of the same type and using the common patterns in combination, desired common patterns of a ceramic multi-layer wiring board can be designed with minimized work time for design.

(2) Since the power supply wiring route ranging from the I/O pins to the semiconductor device can be made constant for individual semiconductor devices of the same type, the amount of DC power supply voltage drop becomes identical for the individual identical type semiconductor devices and as a result the noise margin can be increased.

(3) Efficiency of production and inspection processes in the fabrication of the ceramic multi-layer wiring board can be improved.

(4) Since some I/O pins are thinned out at the boundary between the divisional board areas where semiconductor devices are mounted, identification of the remaining I/O pins is easy to achieve and even after the ceramic multi-layer wiring board is mounted to a printed wiring board, the I/O pins can be identified with ease.

(5) Because of spacing attributable to the thinned-out I/O pins, wiring on the printed wiring board can be done easily to eliminate trouble of through-hole necking.

We claim:

1. A pin grid array type multi-chip module structure comprising:
   a ceramic multi-layer wiring board having opposing first and second surfaces;
   a plurality of connecting pads arrayed on said first surface to mount a plurality of semiconductor devices on said first surface;
   a plurality of through-holes within said board;
   a plurality of I/O pins arrayed on said second surface including power supply pins and signal pins,
   wherein a predetermined area of said board is divided into a plurality of divisional board areas each having the same size, each of said divisional board areas being allotted to individual semiconductor devices of a same type, said connecting pads, said through-holes and said I/O pins being supplied equally to each of said divisional board areas, and wherein positional relationships between said connecting pads, said through-holes and said I/O pins are substantially identical for each divisional board area; and,
   a plurality of selected layers, wherein said selected layers include metallized patterns for supplying power inside said board, said patterns being connectable to said power supply pins via said through-holes whereby said patterns are made constant for each divisional board area.

2. A multi-chip module structure according to claim 1, wherein said power supply pins includes power voltage supply pins and grounding pins.

3. A multi-chip module structure according to claim 1, wherein said selected layers include:
   a top layer having said connecting pads for mounting said semiconductor devices on said first surface;
   an expansion layer connected to another surface of said top layer, for transferring the grid pitch of said connecting pads to the grid pitch of through-holes inside said board;
   a conversion layer for transferring the grid pitch of said through holes inside said board to the grip pitch of said I/O pins;
   a bottom layer having pads for connection to said I/O pins on said second surface, another surface of said bottom layer being connected to said conversion layer; and pairs of signal wiring layers and power supply layers wherein said signal wiring layers a not one at said selected layers, said pairs being stacked on each other such that the signal wiring layer and the power supply layer are disposed alternately, said pairs being inserted between said expansion layer and said conversion layer, wherein in each pair, said signal wiring layer provides wiring between said semiconductor devices, said power supply layer having a predetermined metallized pattern in the divisional area dedicated to each of the semiconductor devices of the same type, to perform matching of characteristic impedances of signal conductors on said signal wiring layers.

4. A multi-chip module structure according to claim 1, having another predetermined area of said board divided into a plurality of divisional board areas each having another size, and each of said another-sized divisional board areas being allotted to semiconductor devices of another type, said connecting pads, said through-holes and said I/O pins being supplied equally to each of said another-sized divisional board areas, positional relationships between said connecting pads, said through-holes and said I/O pins being made identical for every another-sized divisional board area and metallized patterns for supplying power inside said board connected to said power supply pins via the through-holes said metallized patterns being made constant for every another-sized divisional board area.

* * * * *